US012665585B1

(12) United States Patent
Dedic et al.

(10) Patent No.: US 12,665,585 B1
(45) Date of Patent: Jun. 23, 2026

(54) HIGH SPEED CURRENT MODE MUX WITH INDUCTIVE INPUT

(71) Applicant: Cisco Technology, Inc., San Jose, CA (US)

(72) Inventors: Ian Dedic, Maynard, MA (US); Darren Walker, Maynard, MA (US)

(73) Assignee: Cisco Technology, Inc., San Jose, CA (US)

( * ) Notice: Subject to any disclaimer, the term of this patent is extended or adjusted under 35 U.S.C. 154(b) by 34 days.

(21) Appl. No.: 18/406,969

(22) Filed: Jan. 8, 2024

(51) Int. Cl.
*H03K 17/00* (2006.01)
*H03M 1/66* (2006.01)

(52) U.S. Cl.
CPC ............ *H03K 17/002* (2013.01); *H03M 1/66* (2013.01)

(58) Field of Classification Search
CPC ............................... H03M 1/66; H03K 17/002
See application file for complete search history.

(56) References Cited

U.S. PATENT DOCUMENTS

2024/0387345 A1* 11/2024 Sadineni ............. H01L 21/4846

FOREIGN PATENT DOCUMENTS

WO      WO-2022271946 A1 * 12/2022   ............ H03M 1/662

* cited by examiner

*Primary Examiner* — Patrick C Chen
(74) *Attorney, Agent, or Firm* — Patterson + Sheridan, LLP

(57) ABSTRACT
In one embodiment, the disclosure relates to a method of adjusting a current steering multiplexer. The method includes providing a first subDAC comprising a first current mode output; providing a second subDAC comprising a second current mode output; and providing a current mode multiplexer. The method may also include clocking the current mode multiplexer using a first clock signal having a first frequency; clocking the first subDAC using a second clock signal having a second frequency; clocking the second subDAC using the second clock signal, wherein the second frequency is twice the first frequency; and combining currents from the first current mode output and the second current mode output.

12 Claims, 3 Drawing Sheets

HIGH SPEED CURRENT MODE MUX WITH INDUCTIVE INPUT

FIELD

This disclosure relates generally to the field of digital to analog conversion in integrated circuits.

BACKGROUND

Contemporary integrated circuits make extensive use of digital to analog converter circuits that are advantageously mass-produced in various configurations for various purposes.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DESCRIPTION OF EXAMPLE EMBODIMENTS

Overview

In part, the disclosure relates to a method of adjusting a current steering multiplexer. The method includes providing a first subDAC comprising a first current mode output; providing a second subDAC comprising a second current mode output; and providing a current mode multiplexer. The method may also include clocking the current mode multiplexer using a first clock signal having a first frequency; clocking the first subDAC using a second clock signal having a second frequency; clocking the second subDAC using the second clock signal, wherein the second frequency is twice the first frequency; and combining currents from the first current mode output and the second current mode output.

Example Embodiments

In part, in one aspect, the disclosure relates to a 2:1 mux (multiplexor), to be used with even and odd subDACs (digital to analog converters), wherein a differential current-mode signal from each subDAC is carried to the mux over a pair of coupled inductors. In one aspect, coupled inductors in an interconnect are implemented as loops or half-loops in a ground shield of a transmission line. In one aspect, Applicant has realized that inductors, together with capacitive parasitic elements, form a high-impedance resonant RC circuit precluding charging and discharging of capacitive parasitic elements that would otherwise occur. In some embodiments, the multiplexer is a current steering multiplexer. In some embodiments, the multiplexer is a current mode multiplexer.

Figure 1:
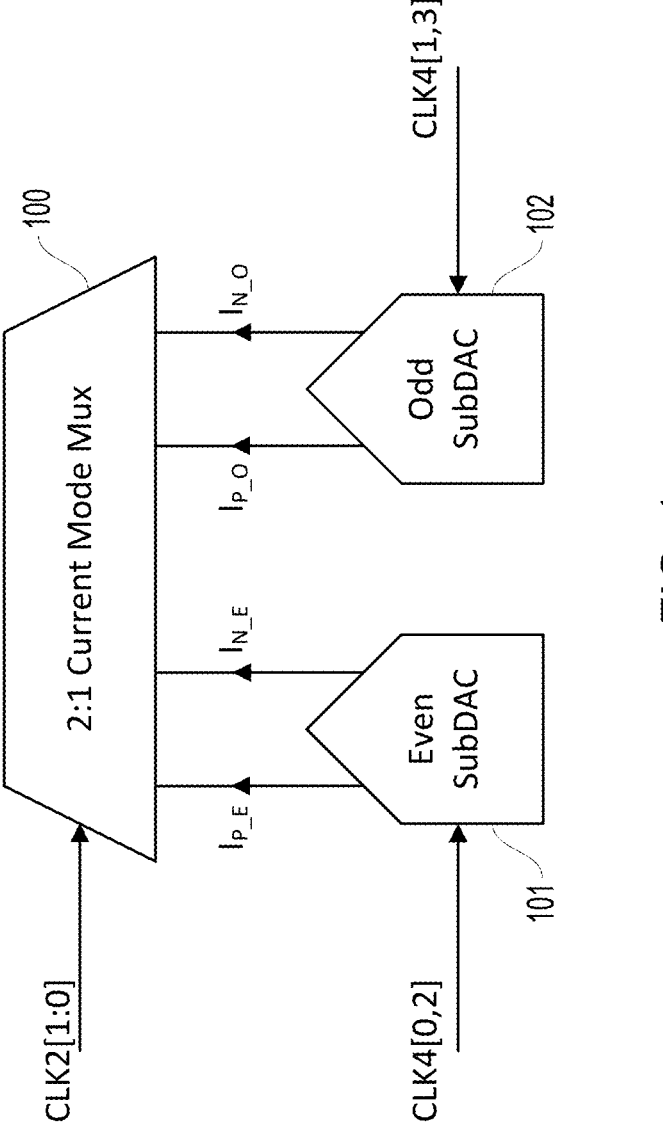
FIG. 1 is a high-level diagram of a 2:1 current mode mux selecting between even and odd segmented subDACs according to an exemplary embodiment of the disclosure.

A high-performance digital to analog converter (DAC) operating at hundreds of gigasamples per second (>100 GS/s) may be limited in speed and bandwidth by capacitive parasitic elements. DAC architectures may be bitwise-segmented to avoid large instantaneous power spikes when switching between certain input words. To achieve sample rates significantly higher than 100 GS/s, one approach is to implement additional multiplexing. Two time-interleaved subDACs can run at half the speed, and their current mode outputs combined by a current mode multiplexor before going to a final DAC output. Refer, for example, to the embodiment of FIG. 1, wherein a 2:1 mux 100 time-interleaves an even subDAC 101 and an odd subDAC 102. The 2:1 mux samples the subDACs alternatingly according to a two-phase clock CLK2 and the subDACs operate at half the rate of CLK2, according to a four-phase clock CLK4. Each subDAC produces a differential current-mode output ($I_P$, $I_N$). Other techniques, such has using a single subDAC with four phases of clock have additional challenges with matching clock skew between the four phases. Additionally, due to the 25:75 duty cycle, the clocks could not be tuned which would result in higher overall power. In various embodiments, a given subDAC may be coupled or in communication with the multiplexer through an interconnect. Various interconnects may be used and may include one or more signal lines in some embodiments. The interconnect or interconnects may be loops or half-loops in a ground shield in some embodiments.

Figure 2:
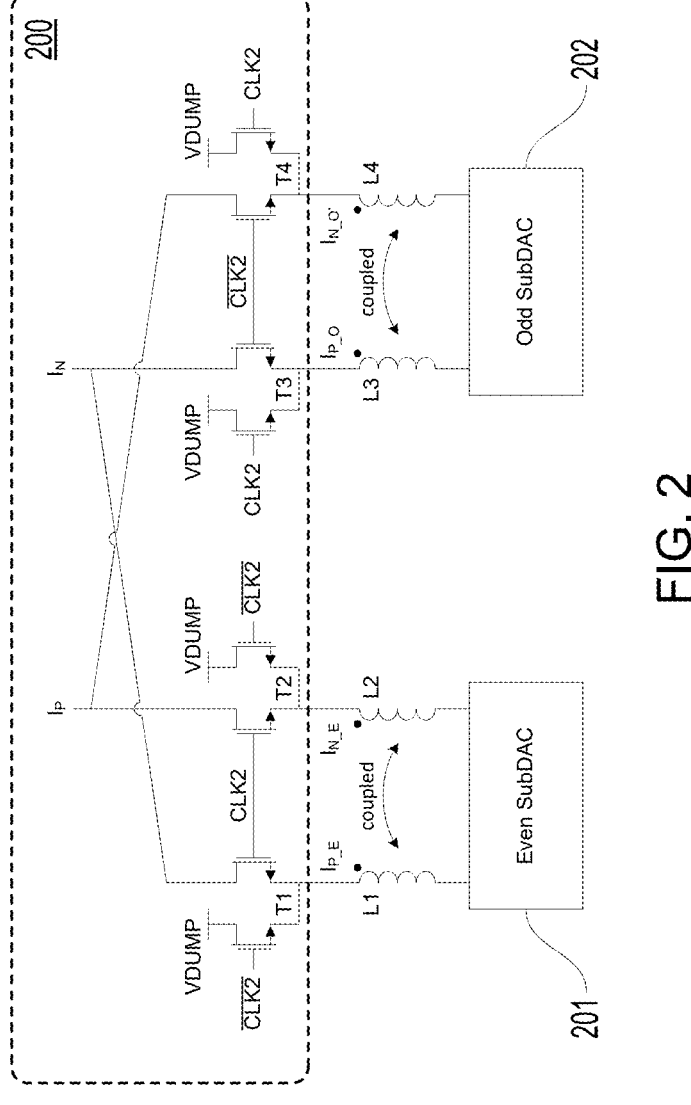
FIG. 2 is transistor-level schematic of a high speed 2:1 current mode mux with inductive input according to an exemplary embodiment of the disclosure.

In some embodiments, clock signals in high-sample-rate DACs may be sine-rather than square-wave clocks due to high operating frequencies and parasitic components in clock distribution networks. In some embodiments, sine wave clocks may introduce a voltage ripple at input output nodes of subDACs or at input nodes of a multiplexor. A voltage ripple may charge and discharge unavoidable device parasitic capacitances, wasting current, limiting bandwidth, and reducing performance of a DAC. In some embodiments, the current disclosure uses inductors and transmission lines to tune out parasitic capacitance and achieve higher device bandwidth. In some embodiments each subDAC or DAC may have a sampling rate. A combined sampling rate of the first subDAC and the second subDAC is at least about 80 gigasamples per second in some embodiments. A given subDAC is typically in communication with an inductor in various embodiments. Various inductors may be coupled relative to a switch, tail node, subDAC, or other components disclosed herein Refer now to the exemplary embodiment of FIG. 2, wherein a transistor-level schematic of a 2:1 current-mode mux 200 is shown. The mux selects currents from an even subDAC 201 when CLK2 is high and currents from an odd subDAC 202 when CLK2 is low. Whenever a subDAC is inactive, i.e. not selected by the multiplexer, its currents are steered into a VDUMP node. The tail nodes T1-T4 have a voltage ripple at a frequency of $2 \cdot f_{CLK2}$. The tail nodes may be defined, in part, and in some embodiments by the connection of two transistors or switches. A given tail node may also be coupled to an inductor in various embodiments and those inductors may be coupled in various configurations. The ripples on T1 and T2 are in phase with each other (common mode). The ripple on T3 and T4 are in phase with each other (common mode). The phase of the ripple on T1 and T2 is 180° out of phase with respect to the ripple on T3 and T4. The parasitic capacitance on T1-T4, from the MOS source parasitic, will be charged and discharged by this ripple, reducing the amount of current which passes to the output. In various embodiments, the disclosure relates to systems, circuits, assemblies, and methods suitable for implementing common-mode tail inductor tuning.

In some embodiments, the odd and even sub-DACs are each clocked at half the frequency of the MUX, but their clocks are in quadrature with each other. As a result, in various embodiments, the MUX selects the output of the one which is not changing, and the one which is changing is steered to the VDUMP node. Various signal lines may be used to connect the subDACs and the multiplexer in many embodiments. In some embodiments, the MUX selectively interleaves the first output of first subDAC and the second output of the second subDAC. A current path may be used to connect the MUX and a subDAC in some embodiments. A given MUX may include various sub-circuits. A set of mux sub-circuits can include various switches, transistors, nodes and other components such as inductors.

In various embodiments, an inductor may be placed in series with the tail nodes to resonate out tail capacitances. However, these inductors will also carry signal current which must be passed through unaffected. In most embodiments, the two inductors on a differential output pair of a subDAC (L1 and L2 on the even subDAC or L3 and L4 on the odd subDAC) are coupled such that the common mode inductance is high to resonate out the common mode ripple on T1 and T2. In addition, the differential inductance should be low so as not to affect the differential signal current. In some embodiments, a small amount of differential inductance may be helpful to peak out differential capacitance. That is, in some embodiments, peaking may be used in the differential path to reduce the effect of differential capacitance of T1 and T2. In various embodiments, peaking may be used in the common mode to reduce the effect of the common mode capacitance on T1 and T2. In some embodiments, peaking may be used to increase or extend bandwidth by connecting an inductor in series with a load resistor to shunt the output capacitor. The inductor may be in communication with one or more signal lines in some embodiments. Signal lines may be used to connect various system components and transmit a current-mode signal. In various embodiments, a first inductor, a second inductor, a third inductor, and a fourth inductor may be used. In some embodiments, the first inductor is part of an output LC transmission line of the MUX sub-circuit and the second inductor is part of an input LC transmission line of the MUX sub-circuit.

Due to the size of all the clock circuits it is difficult to achieve a circuit layout where the connection from the subDACs to the 2:1 mux is minimized in length. However, using a transmission line to bridge the distance gives two benefits: (1) the transmission line impedance can be raised slightly to absorb the differential capacitances at the output of the subDACs and the input of the 2:1 mux, allowing the transmission bandwidth from the subDAC to the 2:1 mux to be maintained and even peaked slightly to improve the overall frequency response of the DAC; and (2) the transmission line impedance can be actively tuned over temperature and process to reduce some of the variability of frequency response, which would otherwise need to be compensated for by a DSP in a coherent transmitter. It is desirable to match the impedances of some components such that they are substantially equal in some embodiments. For example, some methods include tuning an impedance of the first signal line to be substantially equal to an input impedance of the current mode multiplexer.

Figure 3:
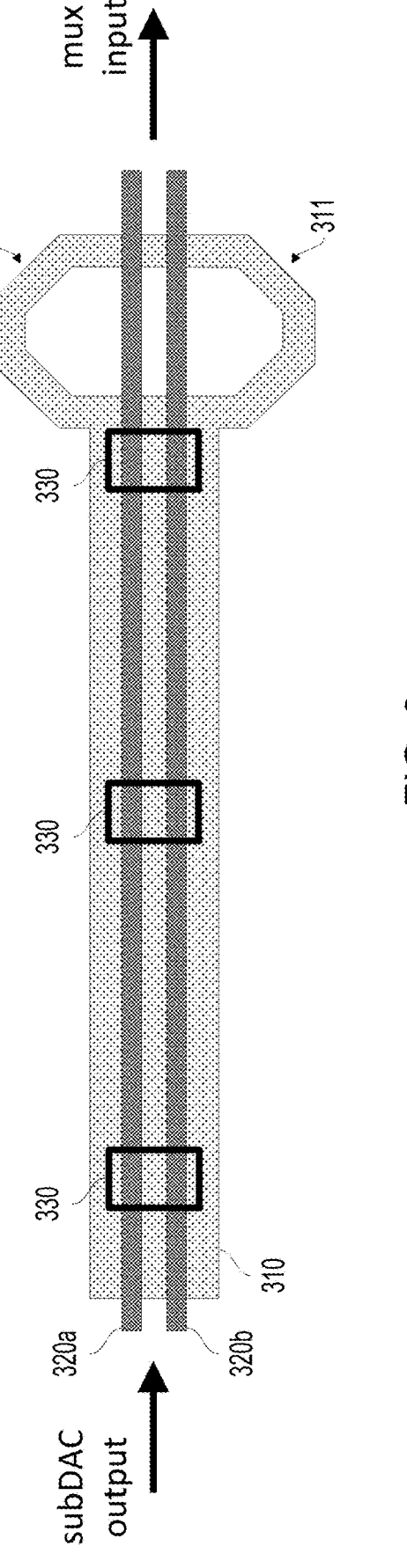
FIG. 3 is a layout diagram of coupled inductors implemented as half-loops in a ground shield of a transmission line according to an exemplary embodiment of the disclosure.

In most embodiments, a common mode inductance that resonates out parasitic capacitances may be implemented in ground shields of a transmission line interconnect. Refer now to the exemplary embodiment of FIG. 3, which is a layout diagram of a transmission line interconnect between a subDAC and a 2:1 multiplexer. Conductors 320a, 320b carry a differential current-mode signal from a subDAC to the 2:1 multiplexer, and half-loops 311, 312 implement coupled inductors in a ground shield 310 of the transmission line. Conductor 320a and conductor 320b may form a differential signal line in some embodiments. Tuning elements 330 in the transmission line allow tuning of the transmission line impedance. Both the common mode inductance and optimized transmission line results in a low power wide bandwidth 2:1 multiplexer. The tuning elements are configured to provide a programmable or otherwise controllable capacitance. In some embodiments, the MUX provides termination of input signals from the first subDAC and the second subDAC such that substantially all current from the first subDAC and the second subDAC appear at an output of the MUX.

In some embodiments, the impedance of a transmission line $Z_0$ may be approximated as $\sqrt{L/C}$. As a result, by adjusting the capacitance of the signal lines, their impedance, $Z_0$ may likewise be adjusted and specified for a given application. The $Z_0$ of the transmission line may be adjusted to substantially match or match the input impedance of the 2:1 current-mode mux. The input impedance of the 2:1 current-mode mux is about $1/g_m$ of the transistors, which varies in response to manufacturing processes and operating temperature. In various embodiments, the transmission Lines can be modelled as distributed LC networks. Multiple variable capacitances or tuning elements distributed along the line may be used in some embodiments to give provide a better response relative to a single larger programmable capacitor placed in one location. In some embodiments, one or more of the first signal line and the second signal line are in electrical communication with one or more programmable capacitors. In many embodiments the mux or multiplexer has two inputs. A given system embodiment may include a multiplexer as a 2:1 current-mode mux and a ground shield. In many embodiments, the first and second inductors are sized such that parasitic capacitances of the first switch and the second switch are substantially absorbed by the input and output LC transmission lines.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, passivation coatings/layers, optical paths, waveguides, splitters, couplers, combiners, electro-optical devices, inputs, outputs, ports, channels, components and parts of the foregoing disclosed herein can be used with any laser, laser-based communication system, waveguide, fiber, transmitter, transceiver, receiver, and other devices and systems without limitation.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately," "substantially," and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. A system comprising:
   a 2:1 multiplexer (MUX) having a first input and a second input;
   a first sub-digital-to-analog (subDAC) having a first output;
   a second subDAC having a second output; a first transmission line electrically coupling the first subDAC to the first input;
   a ground shield for the first transmission line, wherein a first loop inductor is integrated into the ground shield for the first transmission line;
   a second transmission line electrically coupling the second subDAC to the second input; and
   a ground shield for the second transmission line, wherein a second loop inductor is integrated into the ground shield for the second transmission line.

2. The system of claim 1 wherein the MUX selectively interleaves the first output of the first subDAC and the second output of the second subDAC.

3. The system of claim 1, wherein
   the first transmission line is coupled to a first switch in the MUX, and
   wherein the second transmission line is coupled to a second switch in the MUX.

4. The system of claim 3, wherein the first and second loop inductors are sized such that parasitic capacitances of the first switch and the second switch are substantially absorbed by the first and second transmission lines.

5. The system of claim 1, wherein the first and second loop inductors each comprises one or more half-loops.

6. The system of claim 1, wherein the MUX provides termination of input signals from the first subDAC and the second subDAC such that substantially all current from the first subDAC and the second subDAC appear at an output of the MUX.

7. The system of claim 1, wherein the first transmission line comprises a first pair of differential current-mode conductors that connect the first subDAC to the MUX, wherein the first pair of differential current-mode conductors extends over the first loop inductor,
   wherein the second transmission line comprises a second pair of differential current-mode conductors that connect the second subDAC to the MUX, wherein the second pair of differential current-mode conductors extends over the second loop inductor.

8. The system of claim 7, wherein the first loop inductor is disposed on a first end of the ground shield in the first transmission line where the first pair of differential current-mode conductors connect to the MUX,
   wherein the second loop inductor is disposed on a first end of the ground shield in the second transmission line where the second pair of differential current-mode conductors connect to the MUX.

9. The system of claim 8, wherein a second end of the ground shield in the first transmission line does not have a loop, and wherein a second end of the ground shield in the second transmission line does not have a loop.

10. The system of claim 7, further comprising:

a first programmable capacitor disposed over the first pair of differential current-mode conductors and the ground shield in the first transmission line; and a second programmable capacitor disposed over the second pair of differential current-mode conductors and the ground shield in the second transmission line.

11. The system of claim 10, further comprising:

a third programmable capacitor disposed over the first pair of differential current-mode conductors and the ground shield in the first transmission line, wherein the first and third programmable capacitors are disposed at different locations on the first transmission line; and a fourth programmable capacitor disposed over the second pair of differential current-mode conductors and the ground shield in the second transmission line, wherein the second and fourth programmable capacitors are disposed at different locations on the second transmission line.

12. The system of claim 11, wherein the first and third programmable capacitors are disposed over portions of the ground shield in the first transmission line that do not include the first loop inductor, and wherein the second and fourth programmable capacitors are disposed over portions of the ground shield in the second transmission line that do not include the second loop inductor.

\* \* \* \* \*